US 6,670,812 B1

(12) United States Patent
Mock et al.

(10) Patent No.: US 6,670,812 B1
(45) Date of Patent: Dec. 30, 2003

(54) B-VALUE CALCULATION AND CORRECTION USING A LINEAR SEGMENT GRADIENT WAVEFORM MODEL

(75) Inventors: Bryan J. Mock, Lake Mills, WI (US); Charles R. Michelich, Durham, NC (US)

(73) Assignee: GE Medical Systems Global Technology, LLC, Waukesha, WI (US)

( * ) Notice: Subject to any disclaimer, the term of this patent is extended or adjusted under 35 U.S.C. 154(b) by 0 days.

(21) Appl. No.: 10/243,162

(22) Filed: Sep. 13, 2002

(51) Int. Cl.[7] ............................................... G01V 3/00
(52) U.S. Cl. ........................................ 324/309; 324/307
(58) Field of Search ................................ 324/309, 307, 324/311; 600/410; 128/653.2

(56) References Cited

U.S. PATENT DOCUMENTS

| 4,591,789 | A | | 5/1986 | Glover et al. | 324/307 |
|---|---|---|---|---|---|
| 5,539,310 | A | | 7/1996 | Basser et al. | 324/307 |
| 5,671,741 | A | * | 9/1997 | Lang et al. | 128/653.2 |
| 5,864,233 | A | * | 1/1999 | Zhau et al. | 324/309 |
| 5,969,524 | A | * | 10/1999 | Pier-aoli et al. | 324/307 |
| 6,163,152 | A | | 12/2000 | Bernstein et al. | 324/306 |
| 6,259,250 | B1 | | 7/2001 | Mock | 324/309 |
| 6,265,872 | B1 | * | 7/2001 | Heid | 324/307 |
| 6,285,187 | B1 | | 9/2001 | Mock | 324/309 |
| 6,529,001 | B2 | | 3/2003 | Mock | 324/309 |

* cited by examiner

*Primary Examiner*—Edward Lefkowitz
*Assistant Examiner*—Brij B. Shrivastav
(74) *Attorney, Agent, or Firm*—Fletcher Yoder

(57) ABSTRACT

A technique for calculating actual b-values in a diffusion weighted magnetic resonance imaging system and of adjusting the observed b-value until it is within a tolerance range of the prescribed b-value. A diffusion weighted image with the desired diffusion sensitivity may then be produced. Calculation of the actual b-value is accomplished by integrating the linear segments of the gradient waveform. Adjustment of observed b-value is accomplished by initially scaling the diffusion lobe amplitude and comparing a recalculated b-value to the prescribed b-value. Additional adjustment is provided by means of a numeric search iteratively performed until the recalculated b-value is within tolerance of the prescribed b-value.

55 Claims, 8 Drawing Sheets

B-VALUE CALCULATION AND CORRECTION USING A LINEAR SEGMENT GRADIENT WAVEFORM MODEL

BACKGROUND OF THE INVENTION

The present invention relates generally to the field of medical imaging and, more particularly, to the subject of diffusion weighted imaging using magnetic resonance techniques.

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In the field of magnetic resonance imaging (MRI), specialized radio frequency (RF) pulses are used to stimulate susceptible protons so that image information may be collected. Three axes, X, Y, and Z, are employed to acquire sufficient positional information about each proton to construct a three dimensional image. Further, each of the three axes is not uniform but comprises a magnetic gradient, allowing each proton to be measured relative to the axis by its position within the gradient. Absent the gradient, no meaningful positional information could be obtained. Use of specialized RF pulses and three gradient axes is common in MRI techniques.

Because MRI acquires information about susceptible protons, typically hydrogen protons, water and water containing fluids are a common imaging target. In the realm of medical imaging this allows the imaging of diffusion processes involving blood, cerebrospinal fluid, or other water containing bodily fluids. Because fluids are relatively mobile compared to other bodily tissues, special imaging techniques must often be employed.

The overall diffusion weighting, or b-value, describes the sensitivity of an MRI sequence to a diffusion process. In the most common diffusion encoding method, two large gradient pulses are separated by a 180 degree RF refocusing pulse. The b-value for this sequence is given by the Stesjkal-Tanner (S-T) equation:

$$b = (2\pi\gamma)^2 g^2 (\delta^2(\Delta - \delta/3))$$

where $\gamma$ is the gyromagnetic ratio, g is the amplitude of a diffusion lobe associated with the pulse sequence, $\delta$ is the duration of a single diffusion lobe, and $\Delta$ is the interval between the start of a first diffusion lobe to the start of a second diffusion lobe. Typically an operator configures the MRI apparatus with a prescribed b-value to obtain a desired degree of sensitivity to diffusion processes.

However several factors influence the accuracy of the b-values calculated using this equation, and thereby the actual degree of sensitivity obtained in diffusion imaging. First, the S-T equation only considers square gradient waveforms. Square waveforms, however, cannot be achieved in practice due to the finite inductance of the gradient coil. In practice, gradient waveforms are instead trapezoidal, sinusoidal, or some other waveform shape which complicates determining the b-value analytically. These non-square waveforms creates deviations from the desired b-value when the S-T equation is used as an approximation. Therefore, configuring the degree of diffusion sensitivity is problematic, as is knowing the actual degree of diffusion sensitivity associated with an acquired diffusion image.

A second factor that influences the accuracy of the b-values calculated from the S-T equation are the imaging gradients used to localize the proton signal in space. The S-T equation does not take into account the contribution of the imaging gradients to the b-value. Since the b-value is used to calculate various diagnostic measures, such as Apparent Diffusion Coefficients (ADC) and diffusion anisotropy indices, the amount of error contributed by the imaging gradients is particularly important.

A third factor which contributes to the accuracy of the b-value and diffusion sensitivity in an image is the interactions between imaging gradients on each axis. These interactions lead to off-diagonal b-value terms and as a consequence, the diffusion weighting in a sequence is more accurately described by a b-matrix where the on-diagonal b-value terms represent the diffusion weighting along a particular axis and the off-diagonal b-value terms represent interactions between gradients across axes.

There is a need for techniques permitting more precise knowledge of b-values for use in MR imaging applications.

BRIEF DESCRIPTION OF THE INVENTION

The present technique teaches the calculation of true b-values in an MR imaging system. This calculation is generally performed by determining linear segments between corner points of a gradient waveform. Integration of the linear segments is then performed and a true b-value is calculated from the sum.

Further steps may be performed to correct the MR imaging process, and particularly to correct the actual b-value to the desired b-value. Correction may be performed by means of a minimization routine or an iterative search with recalculation of the actual b-value performed after each iteration. Calculation and correction of the b-value is performed upon each axis of the gradient waveform.

BRIEF DESCRIPTION OF THE DRAWINGS

The foregoing and other advantages of the invention will become apparent upon reading the following detailed description and upon reference to the drawings, wherein like reference numerals denote like elements, in which.

BEST MODES FOR CARRYING OUT THE INVENTION

Figure 1:
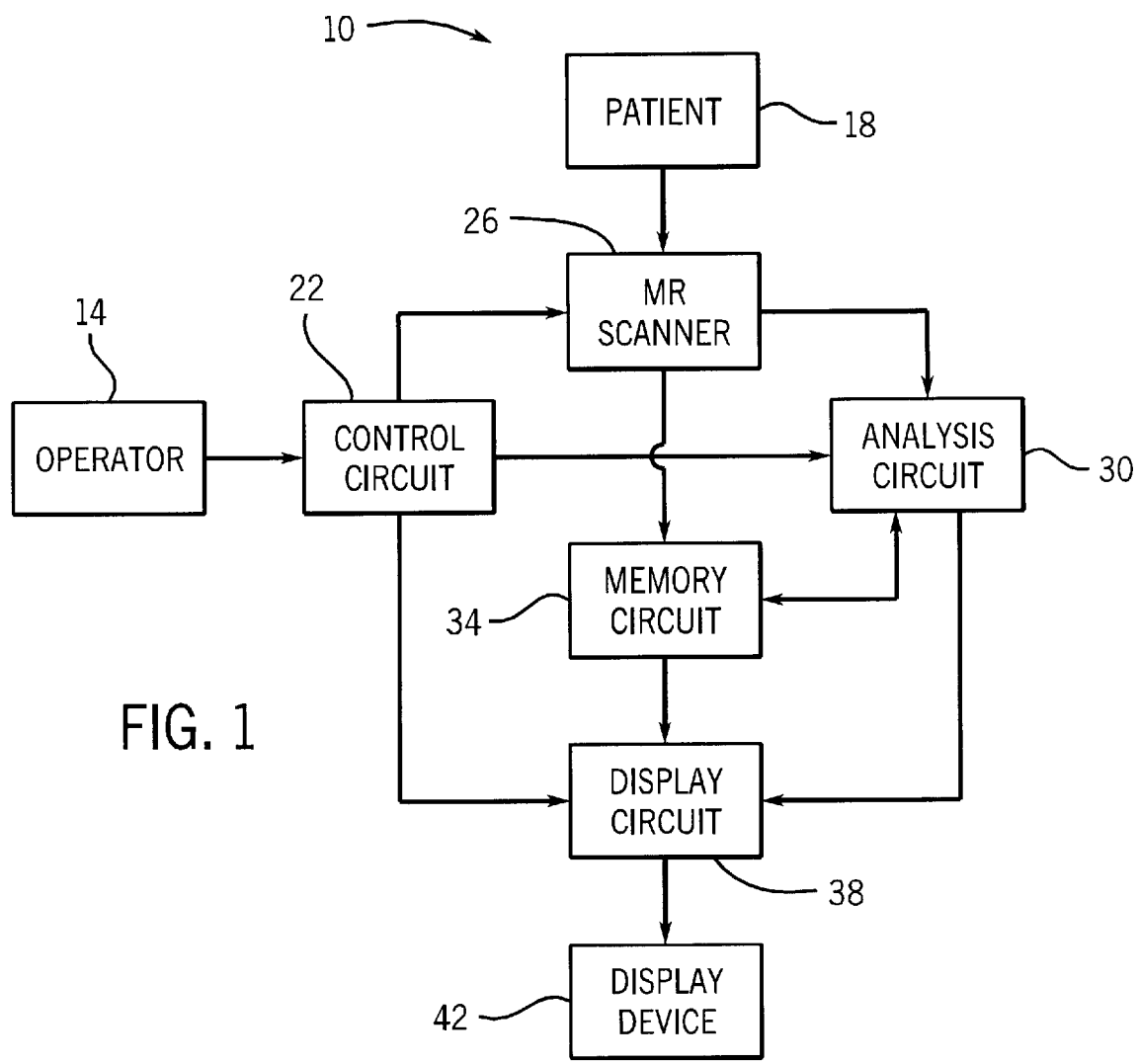
FIG. 1 is a diagrammatical representation of a magnetic resonance imaging system adapted to enhance discrete pixel images of a subject.

Turning now to the drawings and referring initially to FIG. 1, there is depicted a diagrammatical representation of a magnetic resonance system 10 and its constituent components. An operator 14 employs MR system 10 to perform imaging operations upon patient 18. The operator 14 performs these operations via control circuit 22 which controls the operations performed by such constituent components as MR scanner 26, analysis circuit 30, and display circuit 38. Certain utilitarian functions of memory circuit 34 may also be controlled by control circuit 22 but, for purposes of this discussion, the operation of memory circuit 34 will be presumed to be automatic in response to the needs of other component circuits.

The operator 14 performs the imaging operations on patient 18 by instructing MR scanner 26 to execute a series of radio frequency (RF) pulses according to both automated routines and variables configured at control circuit 22. MR scanner 26 collects data derived from these RF pulses which is then passed either directly to an analysis circuit 30 or to a memory circuit 34 which will subsequently provide the data to analysis circuit 30. Analysis circuit 30 applies analytical routines on the data in accordance with the parameters set by operator 14 at control circuit 22 to produce image data. The image data is in turn passed either to memory circuit 34 for later display or directly to display circuit 38 for immediate display in accordance with instructions received from operator 14 via control circuit 22. Display circuit 38 then displays the data on display device 42 for review by the operator or appropriate medical personnel.

One particular type of imaging which MR system 10 is suited for is echo planar imaging (EPI). EPI allows successive echoes from a single TR interval to be acquired, each providing position information, as opposed to phase encoding a separate line of data associated with numerous TR intervals. In this manner EPI drastically reduces the time required for an MRI scan.

As with other types of MRI, to obtain positional information EPI utilizes magnetic gradients along three axes (X, Y, and Z) to provide specific positional data for each proton being imaged. Each gradient imparts differential spin information upon each proton being observed. The spin information, once acquired, allows each proton to be located along each gradient, thus allowing three dimensional positioning of each proton within the derived image. Thus gradients are useful in systems, such as MR system 10, for constructing either two dimensional or three dimensional diagnostic images.

One area in which EPI techniques have proven valuable is in diffusion imaging. Diffusion imaging allows diagnosticians to examine the diffusion patterns in the tissues of a patient. MR diffusion imaging using EPI typically utilizes two large gradient pulses after excitation of the system to perform diffusion weighted imaging. The large gradient pulses are designed to impart phase shifts to proton spins which cancel each other out if the spins are stationary, while spins which have moved undergo an observable phase shift. Therefore, in tissues where the fluid is undergoing random or non-directional motion, the phase shifts within an imaging voxel are partially canceled, creating an attenuated image. In tissues where the fluid undergoes directional motion, the phase shifts do not cancel resulting in a complete signal loss in the image. However, in tissue where the fluid is stationary, the phase shifts cancel and an image highlighting differences in diffusion between tissues can be created. By manipulating the diffusion gradient pulses on the X, Y, and Z axes, the diffusion along particular directions in space can be imaged.

Figure 2:
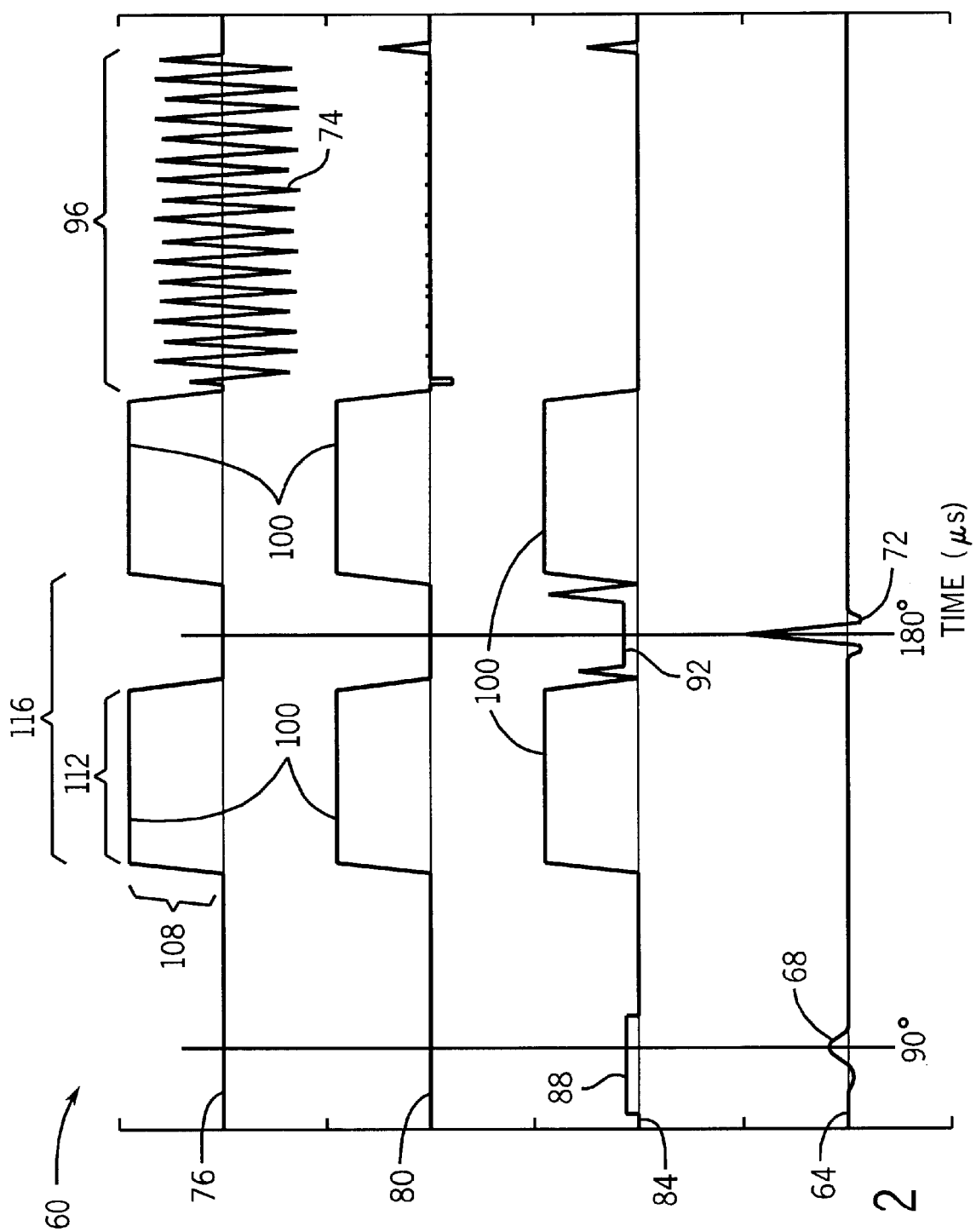
FIG. 2 is a representation of a standard diffusion weighted pulse sequence associated with EPI MRI demonstrating a single refocusing pulse.

Referring now to FIG. 2, an EPI diffusion imaging mode is illustrated by reference to an EPI pulse sequence 60. EPI pulse sequence 60 depicts a spin-echo sequence where the timing of a 90° excitation pulse 68 and a 180° refocusing pulse 72 are shown on a RF axis 64. The spin-echo sequence is used to readout the signal. EPI pulse sequence 60 also depicts an X-gradient axis 76, a Y-gradient axis 80, and a Z-gradient axis 84, each demonstrating the events occurring along those gradients over the same time scale. For example, Z-gradient axis 84 is the slice select gradient axis and reflects the slice select pulse 88 as well as a slice select refocus pulse 92. X-gradient axis 76 is the frequency encoding gradient axis and depicts the readout 96. The readout occurs at echo time (TE) 74, measured from the time of the excitation pulse 68.

All three axes demonstrate the presence of the two large diffusion gradient pulses 100 timed before and after refocusing pulse 72. Diffusion gradient pulses 100 introduce diffusion sensitivity to the EPI sequence. Diffusion encoding is performed by modulating the diffusion gradient pulses 100 on X-axis 76, Y-axis 80, and Z-axis 84 for each diffusion measurement. Also depicted are diffusion lobe amplitude 108, commonly denoted g, diffusion lobe width 112, commonly denoted δ, and diffusion lobe interval 116, commonly denoted Δ.

Figure 3:
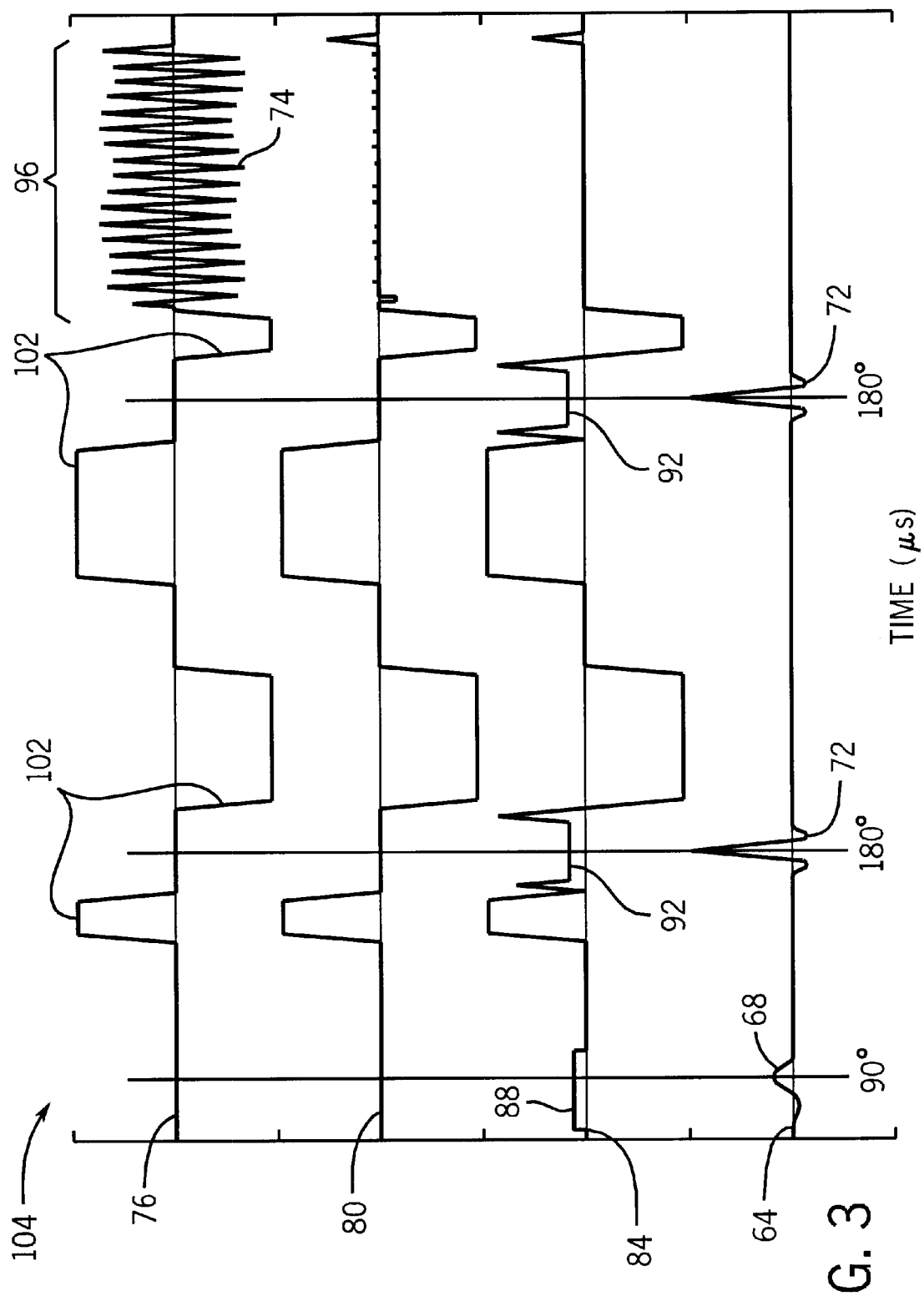
FIG. 3 is a representation of a dual-spin echo diffusion pulse sequence associated with EPI MRI demonstrating a pair of refocusing pulses.

A second EPI diffusion imaging mode is illustrated in FIG. 3 which depicts a dual spin-echo sequence 104 with similar events represented by identical reference numerals. In dual spin-echo sequence 104, an additional refocusing pulse 72 is added and bipolar diffusion lobes 102 are placed around both refocusing pulses 72. The dual spin-echo approach doubles the number of gradient transitions and provides intrinsic refocusing of eddy currents over a fairly wide range of time constants. The dual spin-echo approach increases the minimum echo time (TE) 74, however image distortion that would normally arise from eddy currents induced by diffusion gradients is largely removed. Either imaging mode sequence is capable of producing a diffusion weighted image.

In diffusion weighted imaging, the degree of sensitivity is controlled by a b-value, generally input by operator 14. The b-value is generally given by the Stesjkal-Tanner equation:

$$b_{i,j}=(2\pi\gamma)^2 g_{ij}g_{ij}(\delta^2(\Delta-\delta/3)).$$

Numerous factors, however, can lead to inaccuracies in a b-value calculated using the above equation and, in fact, the diffusion weighting in a sequence is preferably described by a 3×3 matrix of b-values, or b-matrix. Such a b-matrix describes the diffusion sensitivity from on-axis gradients, the on-diagonal terms, and diffusion sensitivity generated by interactions across gradient axes, the off-diagonal terms or cross-terms.

The b-matrix values may be determined by integrating waveforms and including imaging gradients. Integration of the products of the k-space trajectory from the 90° excitation pulse 68 to the echo time (TE) 74 on each gradient axis is given by the equation:

$$b_{i,j} = \int_0^{TE} k_i(t)k_j(t)dt \qquad (1)$$

where the k-space trajectory is given by the equation:

$$k_i(t) = \gamma \int_0^т g_i(t')dt' \quad (2)$$

where i and j each signify gradient axes, k signifies a detected value, γ signifies the gyromagnetic constant, and g signifies the gradient. Equation (2) calculates the k-space trajectory on a gradient axis by integrating the waveform over time. Equation 1 may then be used to integrate the dot-product of the k-space trajectory at each point in time up to TE. This integral is the b-value for the gradient waveform at that point in the matrix. On-diagonal values for the b-matrix are calculated where i=j and represent the diffusional weighting along an axis. Off-diagonal values, where i≠j, represent the interactions between gradients across the axes.

One method of compensating for inaccuracies in the b-value involves calculating the actual b-value on each axis (the on-diagonal b-matrix elements) and correcting for deviations from the desired, user configured b-value. After calculating the actual b-value, corrections for the diffusion lobe amplitudes are performed until the on-diagonal b-matrix values are within a given tolerance.

Figure 4:
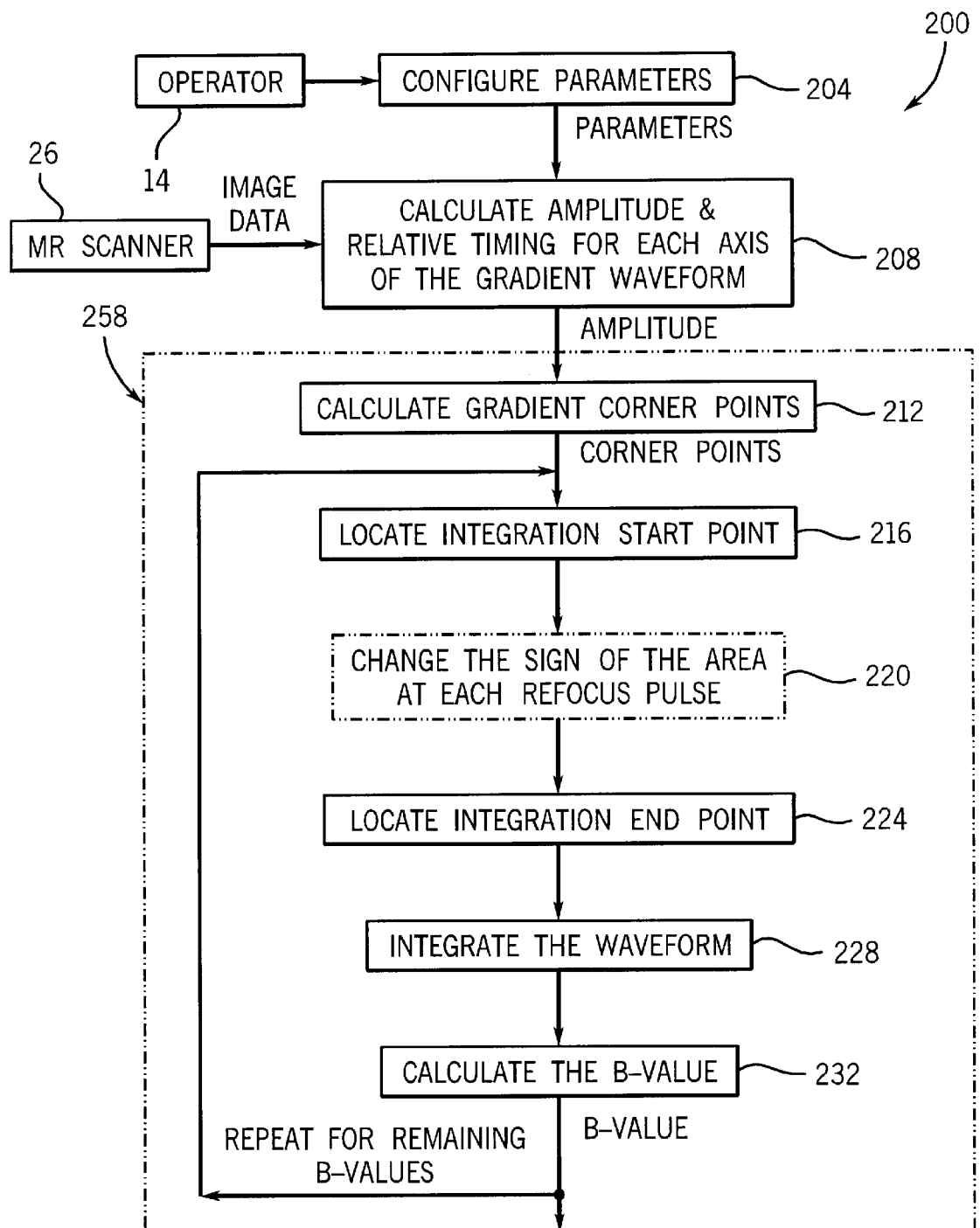
FIG. 4 is a flow chart illustrating steps in exemplary control logic for calculating the actual b-value associated with a MRI image.

Referring now to FIG. 4, exemplary stages in the calculation of an actual b-value are illustrated and designated generally by the reference numeral 200. First, the parameters are configured as indicated at step 204. This configuration includes setting the prescribed resolution, echo time, field of view, or any other relevant imaging parameters. Subsequently, the gradient amplitudes and their respective timing on each axis of the waveform must be calculated, as represented in step 208. To calculate the amplitudes, the image data, from MR scanner 26 and the image parameters, from operator 14 via input step 204, are utilized.

After the amplitudes have been calculated, that information is then used to calculate gradient corner points along each axis in step 212. Corner points are calculated by taking the derivative of the amplitudes along the axes. Those points where slope changes occur are corner points and are kept for further calculation. Non-corner points are discarded.

A starting point for integration along an axis is determined next in step 216 using the corner point information from step 212. To determine the integration starting point, the 90° excitation pulse 68 (see FIGS. 2 and 3) is located in the pulse sequence. If excitation pulse 68 corresponds to a corner point on the gradient axis, integration begins at that point. If excitation pulse 68 does not correspond to a corner point on the gradient axis, an interpolated point is placed between adjacent corner points and integration begins at the interpolated point.

The location of each 180° refocusing pulse 72 (see FIGS. 2 and 3), if any are present, is then determined in step 220. At each refocusing pulse 72, a change in sign of the area occurs since each 180° pulse is basically an inversion. If the refocusing pulse 72 corresponds to a corner point, the change of sign occurs at the corner point. Otherwise an interpolated point is generated between adjacent corner points and the change of sign occurs at the interpolated point.

An integration end point is then calculated in step 224. The end point is calculated by locating TE 74 (see FIGS. 2 and 3) and determining if a corner point corresponds to the TE 74. If the TE 74 corresponds to a corner point, integration stops at that corner point. Otherwise an interpolated point is generated between adjacent corner points and integration stops at the interpolated point.

Once the start point, end point and sign changes have been determined, the gradient waveform along the axis is integrated in step 228. Integration involves determining the k-space trajectory ($k_i(t)$), as given by equation (2), at each corner point using numerical integration of each linear waveform segment. The linear waveform segments are defined as the lines connecting adjacent corner points along the gradient axis. The result of this integration is a vector of trajectory values, k, at various times, t, along the axis.

Once the k-space trajectory vector has been determined in step 228, the actual b-value is determined in step 232. The b-value for a gradient waveform along an axis is determined by solving equation (1) where i=j, i.e. for the on-diagonal element. This value represents the cumulative area of the square of the k-space trajectory calculated in step 228, scaled appropriately. Steps 216 through 232 are repeated until the actual b-value has been calculated for each remaining axis such that the three on-diagonal b-values of the b-matrix ($b_{xx}$, $b_{yy}$, and $b_{zz}$) are determined for all three axes, X, Y, and Z.

It should also be noted that the off-diagonal b-matrix values may also be calculated in step 232 by integrating over the product of two separate k-space trajectory vectors where i≠j, as may be determined in step 228. The off-diagonal b-matrix values may provide valuable information regarding pairwise interactions of gradient waveforms across axes.

Figure 5:
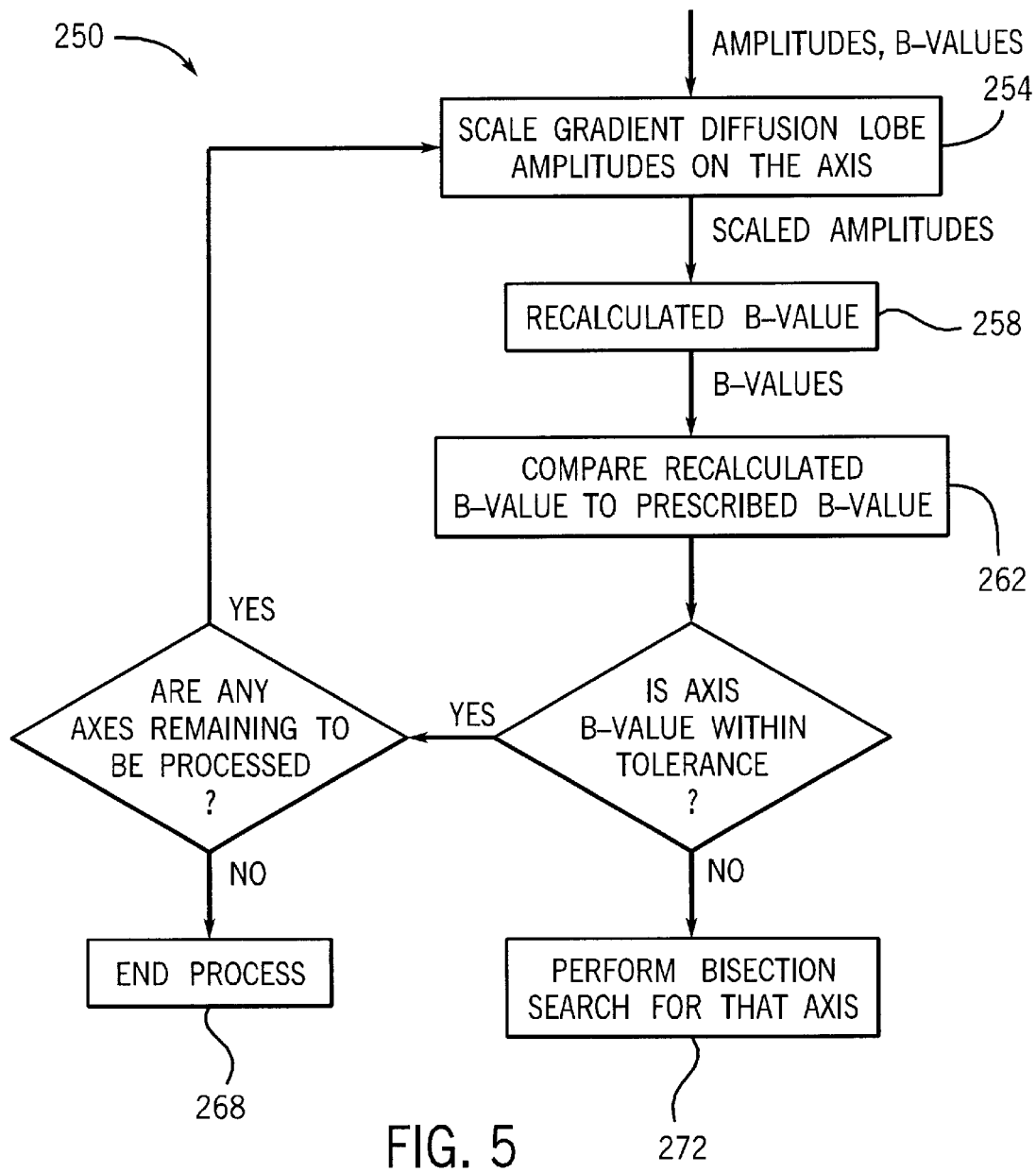
FIG. 5 is a flow chart illustrating the steps in exemplary control logic for correcting b-value deviations.

Once the actual b-values of the image have been calculated, deviations from the desired b-values are corrected. The correction process is described by FIG. 5 and is generally referred to by the reference numeral 250. The correction process begins at step 254 by scaling the gradient diffusion lobes of an axis using the amplitude and b-value information from the previous steps. In step 254, the amplitudes of the gradient diffusion lobes on a gradient axis are scaled by the square root of the prescribed b-value to the calculated b-value according to the equation:

$$G'_{diffusion} = G^0_{diffusion} * \sqrt{\frac{b - value_{prescribed}}{b - value_{calculated}}} \quad (3)$$

The scaling process is then repeated for each remaining axis, as needed, until the amplitudes of the diffusion lobes on each gradient axis, X, Y, and Z, have been scaled.

After the diffusion lobes have been scaled, b-values for each axis are recalculated in step 258 by repeating steps 212 through 232 (as outlined in FIG. 4) using the scaled amplitude values. The recalculated b-values are then compared to the prescribed b-value in step 262. If the recalculated b-values ($b_{xx}$, $b_{yy}$, and $b_{zz}$) are within a given tolerance of the prescribed b-value, no further compensation is performed and the process is ended in step 268. However, if one or more of the recalculated b-values are outside the given tolerance, further fine adjustments are made to the b-value in step 272.

Figure 6:
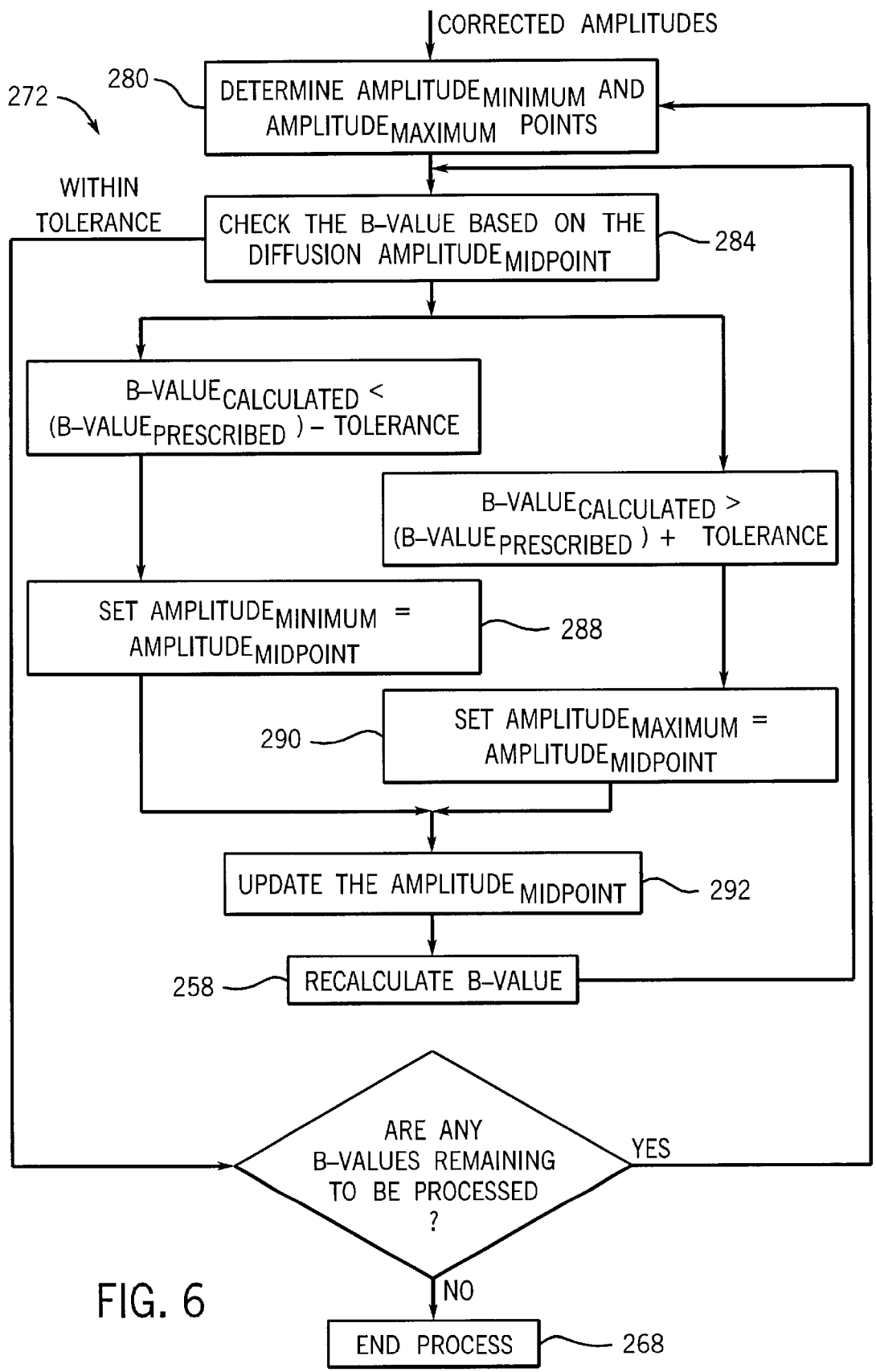
FIG. 6 is a flow chart illustrating the steps in exemplary control logic for applying fine adjustments to corrected b-values.

The fine adjustments to the b-value are accomplished by iteratively adjusting the diffusion lobe amplitude using a numeric search in step 272, as depicted in FIG. 6. In one embodiment, the numeric search may take the form of a bisection search, as illustrated in FIG. 6, however a variety of numeric searches which allow fine, corrective adjustments to be made may be used as well. In FIG. 6, at step 280, the minimum and maximum diffusion amplitude points that bracket the desired b-value of an axis are determined. The maximum diffusion amplitude point is set to some number greater than the corrected diffusion amplitude determined in step 254 of FIG. 5, such as 110% of the corrected diffusion amplitude. The minimum diffusion amplitude point is set to some number less than the corrected diffusion amplitude, such as 90% of the corrected diffusion amplitude. Therefore the corrected diffusion amplitude is an intermediate amplitude bracketed by the maximum and minimum diffusion amplitudes, typically the midpoint. Indeed, in the bisection search described by FIG. 6 the intermediate point is the midpoint diffusion amplitude.

Next, the calculated b-value, based upon this midpoint diffusion amplitude, is checked against the prescribed b-value, in step 284, to determine whether the calculated b-value is within the desired tolerance level. Note that in the first iteration, the calculated b-value is known to be outside the tolerance. For subsequent iterations, however, a b-value is re-calculated, in step 258, and may be within the desire tolerance, thereby ending processing.

If the calculated b-value is less than the prescribed b-value minus the tolerance value, the minimum amplitude is set equal to the midpoint amplitude in step 288. Likewise, if the calculated b-value is greater than the prescribed b-value plus the tolerance value, the maximum amplitude is set equal to the midpoint amplitude in step 290.

Next, in step 292, the midpoint amplitude is revised such that:

$$\text{Amplitude}_{midpoint} = \text{Amplitude}_{minimum} + (0.5 * (\text{Amplitude}_{maximum} - \text{Amplitude}_{minimum})). \quad (4)$$

The revised midpoint amplitude is then used to recalculate the b-value in step 258 (referring back to FIG. 4). The revised b-value is then checked against the prescribed b-value at step 284. If the revised b-value is within tolerance, any remaining axes are processed. However if the revised b-value is still outside of the tolerance range, the amplitude midpoint is again iteratively adjusted as per step 284. The process ends at step 268 when the b-value is within tolerance and there are no remaining axes to be processed. While the bisection search depicted in FIG. 6 and described in the preceding text illustrates one embodiment of an acceptable numeric search, those skilled in the art will recognize that other numeric searches may be used to obtain the same type of b-value correction.

Figure 7:
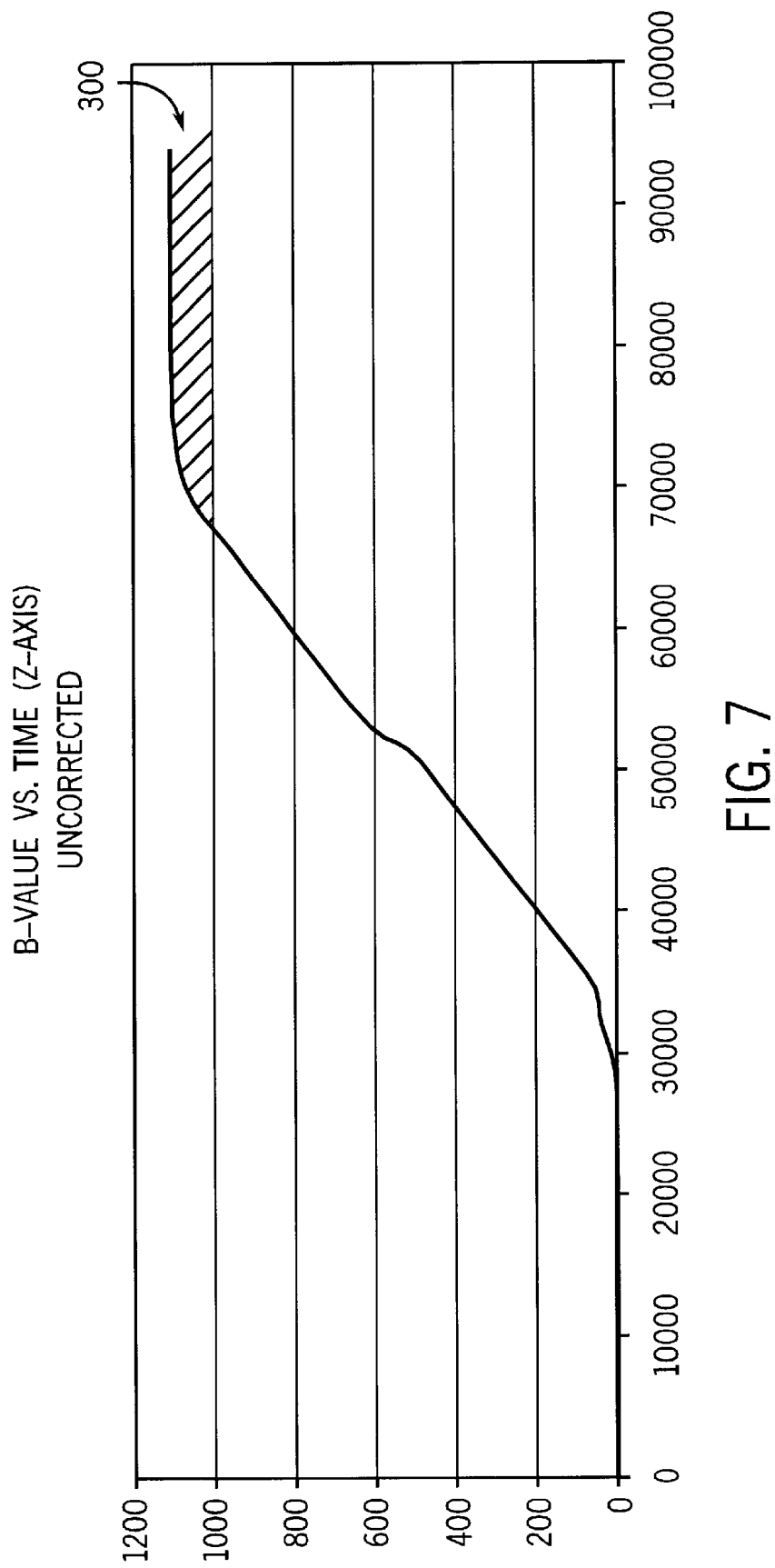
FIG. 7 is a plot of uncorrected b-value versus time.
Figure 8:
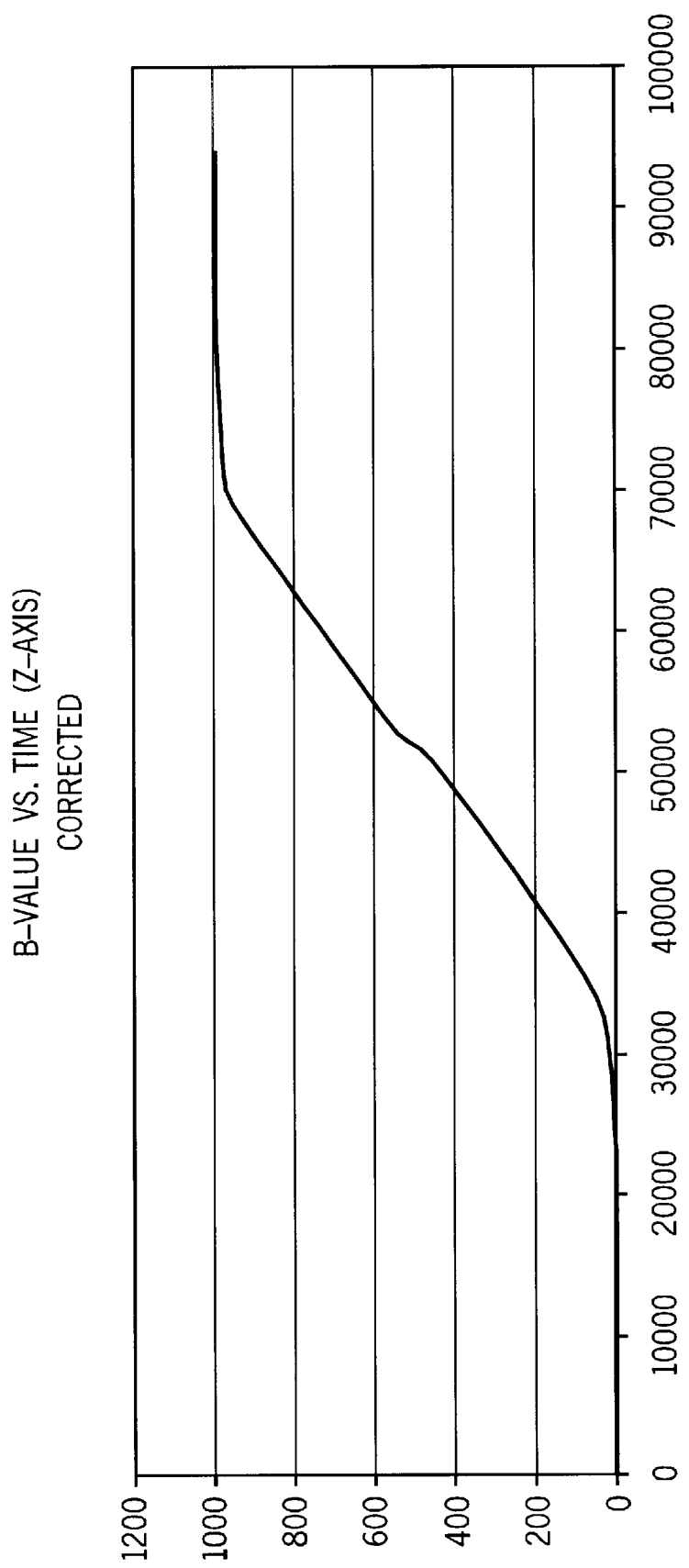
FIG. 8 is a plot of corrected b-value versus time.

The result of b-value correction can be seen in FIGS. 7 and 8. FIG. 7 is a graph showing b-value plotted against time in microseconds before correction where an operator has configured a b-value of 1000. Shaded deviation 300 illustrates the uncorrected error, here approximately 15%. FIG. 8 demonstrates the same data after calculation and correction of the b-value by the present technique. After scaling of the diffusion lobe amplitudes, b-value error is less than 1% from the prescribed value. Reduction of the b-value error allows for greater operator control in MR diffusion weighted imaging by allowing more precise control of the sensitivity of the device to diffusion processes.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for calculating a b-value comprising:
   generating a gradient waveform comprising a plurality of timing data points and one or more waveform data points using a magnetic resonance imaging technique;
   calculating two or more corner points associated with the gradient waveform;
   determining an integration start point such that the start point corresponds to an excitation pulse generated by the magnetic resonance imaging technique;
   determining an integration end point such that the end point corresponds to an echo time resulting from the excitation pulse;
   generating an area sum by integrating one or more linear waveform segments between the start point and the end point wherein each linear waveform segment is defined by a line connecting adjacent corner points; and
   calculating the b-value using the area sum.

2. The method of claim 1, further comprising the act of determining one or more inversion points corresponding to one or more refocusing pulses.

3. The method of claim 1, wherein calculating the two or more corner points comprises taking a derivative of the gradient waveform.

4. The method of claim 3, wherein each corner point corresponds to a change in slope.

5. The method of claim 1, wherein determining the integration start point comprises designating the corner point which corresponds to the excitation pulse as the start point.

6. The method of claim 1, wherein determining the integration start point comprises interpolating between two adjacent corner points to create an interpolated point which corresponds to the excitation pulse and designating the interpolated point as the start point.

7. The method of claim 1, wherein determining the integration end point comprises designating the corner point which corresponds to the echo time as the end point.

8. The method of claim 1, wherein determining the integration end point comprises interpolating between two adjacent corner points to create an interpolated point which corresponds to the echo time and designating the interpolated point as the end point.

9. The method of claim 1, further comprising determining one or more sign change points such that each sign change point corresponds to a refocusing pulse generated by the magnetic resonance imaging technique.

10. The method of claim 9, wherein determining each sign change point comprises designating the corner point which corresponds to the refocusing pulse as the sign change point.

11. The method of claim 9, wherein determining each sign change point comprises interpolating between two adjacent corner points to create an interpolated point which corresponds to the refocusing pulse and designating the interpolated point as the sign change point.

12. The method of claim 1, wherein generating the area sum is accomplished by numerical integration.

13. The method of claim 1, further comprising discarding a plurality of non-corner points.

14. The method of claim 1, wherein generating the area sum comprises determining a k-space trajectory at each corner point using numerical integration on each linear waveform segment.

15. The method of claim 14, further comprising determining one or more sign change points such that each sign change point corresponds to a refocusing pulse generated by the magnetic resonance imaging technique.

16. The method of claim 15, wherein determining each sign change point comprises designating the corner point which corresponds to the refocusing pulse as the sign change point.

17. The method of claim 15, wherein determining each sign change point comprises interpolating between two adjacent corner points to create an interpolated point which corresponds to the refocusing pulse and designating the interpolated point as the sign change point.

18. The method of claim 15, wherein generating the area sum comprises changing signs at each sign change point during numerical integration.

19. The method of claim 18, wherein calculating the b-value comprises calculating a cumulative area of the square of the k-space trajectory.

20. The method of claim 14, wherein calculating the b-value comprises calculating a cumulative area of the square of the k-space trajectory.

21. A method for correcting one or more b-values comprising:
scaling an initial amplitude of a gradient diffusion lobe on a gradient axis to produce a scaled amplitude;
calculating a b-value for the axis using the scaled amplitude;
comparing the b-value with a prescribed b-value; and
adjusting the scaled amplitude if the b-value is outside a given tolerance of the prescribed b-value such that the adjustment is performed iteratively until the b-value is not outside the given tolerance of the prescribed b-value.

22. The method of claim 21, wherein the initial amplitude is scaled by a square root of a ratio of the prescribed b-value to an initial b-value.

23. The method of claim 22, wherein the initial b-value is calculated by integrating one or more linear waveform segments defined by two or more corner points of a gradient waveform.

24. The method of claim 21, wherein adjusting the scaled amplitude comprises a numeric search.

25. The method of claim 24, further comprising determining a minimum diffusion amplitude point which is initially less than the scaled amplitude and a maximum diffusion amplitude point which is initially greater than the scaled amplitude, wherein an intermediate point initially equals the scaled amplitude.

26. The method of claim 25, wherein the minimum diffusion amplitude point and the maximum diffusion amplitude point are equidistant from the intermediate point.

27. The method of claim 25, further comprising setting the minimum diffusion amplitude equal to the intermediate point if the b-value is less than the prescribed b-value minus the given tolerance but setting the maximum diffusion amplitude equal to the intermediate point if the b-value is greater that the prescribed b-value plus the given tolerance.

28. The method of claim 27, further comprising updating the intermediate point according to a mathematical function after setting the minimum diffusion amplitude or the maximum diffusion amplitude.

29. The method of claim 28, wherein the mathematical function updates the intermediate point to equal the (minimum amplitude point)+(0.5)(maximum amplitude point−minimum amplitude point).

30. The method of claim 28, further comprising recalculating the b-value based upon the intermediate point after updating.

31. A magnetic resonance imaging system which calculates a b-matrix consisting of one or more b-values comprising:
a magnetic resonance imaging scanner configured to collect one or more gradient waveforms comprising a plurality of timing data points and one or more waveform data points;
an analysis circuit configured to generate an output, to receive the gradient waveforms, and to calculate one or more b-values from the gradient waveforms such that the analysis circuit integrates one or more linear waveform segments comprising a gradient waveform to generate an area sum such that the actual b-values are calculated based upon the area sums;
a display circuit configured to receive the output and to preferably display the output via a display device; and
a control circuit configured to control the operation of the magnetic resonance imaging scanner, the analysis circuit, and the display circuit.

32. The system of claim 31, wherein the analysis circuit determines two or more corner points, an integration start point, an integration end point, one or more sign change points, and one or more linear waveform segments.

33. The system of claim 32, wherein the analysis circuit determines the corner points by taking the derivative of the gradient waveform.

34. The system of claim 33, wherein the analysis circuit integrates using numerical integration.

35. The system of claim 31, further comprising a memory circuit configured to receive the gradient waveform such that the analysis circuit receives the gradient waveform from the memory circuit.

36. The system of claim 31, further comprising a memory circuit configured to receive the output such that the display circuit receives the output from the memory circuit.

37. The system of claim 31, wherein the b-matrix is a 3×3 matrix.

38. The system of claim 37, wherein the b-values of the b-matrix are the one or more actual b-values calculated by the analysis circuit.

39. The system of claim 31, wherein the b-matrix is a 3×1 matrix.

40. The system of claim 39, wherein the b-value of the b-matrix is the actual b-value calculated by the analysis circuit.

41. A device for correcting one or more b-values comprising:
a magnetic resonance imaging scanner configured to collect a gradient waveform comprising a plurality of timing data points and one or more waveform data points;
an analysis circuit configured to form an output and to generate a scaled amplitude from an initial amplitude of a gradient diffusion lobe and to iteratively adjust the scaled amplitude if a calculated b-value is outside a given tolerance to a prescribed b-value;
a display circuit configured to receive the output and to preferably display the output via a display device; and
a control circuit configured to control the operation of the magnetic resonance imaging scanner, the analysis circuit, and the display circuit.

42. The device of claim 41, further comprising a memory circuit configured to receive the gradient waveform such that the analysis circuit receives the gradient waveform from the memory circuit.

43. The device of claim 41, further comprising a memory circuit configured to receive the output such that the display circuit receives the output from the memory circuit.

44. The device of claim 41, wherein the analysis circuit scales the initial amplitude by a square root of a ratio of the prescribed b-value to an initial b-value.

45. The device of claim 41, wherein the analysis circuit iteratively adjusts the scaled amplitude by performing one or more numeric searches.

46. A method for determining a b-matrix of one or more b-values comprising:
  calculating each b-value, the act of calculating comprising:
    generating a gradient waveform comprising a plurality of timing data points and one or more waveform data points using a magnetic resonance imaging technique;
    calculating two or more corner points associated with the gradient waveform;
    determining an integration start point such that the start point corresponds to an excitation pulse generated by the magnetic resonance imaging technique;
    determining an integration end point such that the end point corresponds to an echo time resulting from the excitation pulse;
    generating an area sum by integrating one or more linear waveform segments between the start point and the end point wherein each linear waveform segment is defined by a line connecting adjacent corner points; and
    calculating the b-value using the area sum.

47. The method of claim 46, wherein the b-matrix is a 3×3 matrix.

48. The method of claim 46, wherein the b-matrix is a 3×1 matrix.

49. The method of claim 46, wherein the act of calculating a b-value further comprises the act of determining one or more inversion points corresponding to one or more refocusing pulses.

50. The method of claim 46, wherein calculating the two or more corner points comprises taking a derivative of the gradient waveform.

51. The method of claim 46, wherein the act of calculating a b-value further comprises determining one or more sign change points such that each sign change point corresponds to a refocusing pulse generated by the magnetic resonance imaging technique.

52. The method of claim 51, wherein generating the area sum comprises changing signs at each sign change point during numerical integration.

53. The method of claim 46, wherein generating the area sum is accomplished by numerical integration.

54. The method of claim 46, wherein generating the area sum comprises determining a k-space trajectory at each corner point using numerical integration on each linear waveform segment.

55. The method of claim 54, wherein calculating the b-value comprises calculating a cumulative area of the square of the k-space trajectory.

* * * * *